United States Patent [19]

Tokura et al.

[11] Patent Number: 5,545,908

[45] Date of Patent: Aug. 13, 1996

[54] VERTICAL TYPE INSULATED-GATE SEMICONDUCTOR DEVICE

[75] Inventors: Norihiro Tokura, Okazaki; Naoto Okabe, Chita-gun, both of Japan

[73] Assignee: Nippondenso Co., Ltd., Kariya, Japan

[21] Appl. No.: 98,396

[22] PCT Filed: Dec. 7, 1992

[86] PCT No.: PCT/JP92/01596

§ 371 Date: Jan. 27, 1994

§ 102(e) Date: Jan. 27, 1994

[87] PCT Pub. No.: WO93/12545

PCT Pub. Date: Jun. 24, 1993

[30] Foreign Application Priority Data

Dec. 9, 1991 [JP] Japan ................................. 3-324734

[51] Int. Cl.$^6$ ........................ H01L 29/78; H01L 29/739
[52] U.S. Cl. ........................................ 257/341; 257/139
[58] Field of Search ................................ 257/139, 341, 257/342

[56] References Cited

U.S. PATENT DOCUMENTS

| | | |
|---|---|---|
| 4,376,286 | 3/1983 | Lidow et al. . |
| 4,399,449 | 8/1983 | Herman et al. . |
| 4,593,302 | 6/1986 | Lidow et al. . |
| 4,680,853 | 7/1987 | Lidow et al. . |
| 4,902,636 | 2/1990 | Akiyama et al. .................. 437/45 |
| 5,047,813 | 9/1991 | Harada ............................. 257/341 |

FOREIGN PATENT DOCUMENTS

| | | |
|---|---|---|
| WO8202981 | 9/1982 | European Pat. Off. . |
| 118921 | 9/1984 | European Pat. Off. . |
| 222326 | 5/1987 | European Pat. Off. . |
| WO9310563 | 5/1993 | European Pat. Off. . |
| 52-106688 | 9/1977 | Japan . |
| 57-42164 | 3/1982 | Japan . |
| 60-196974 | 10/1985 | Japan . |
| 60-254658 | 12/1985 | Japan . |
| 61-225868 | 10/1986 | Japan . |
| 62-150769 | 7/1987 | Japan . |
| 63-266882 | 11/1988 | Japan . |
| 64-82565 | 3/1989 | Japan . |
| 251278 | 2/1990 | Japan . |
| 281476 | 3/1990 | Japan . |
| 286136 | 3/1990 | Japan . |
| 330310 | 4/1991 | Japan . |

OTHER PUBLICATIONS

T. P. Chow, "Counterdoping of MOS Channel (CDC)—A New Technique of Improving ... " I.E.E.E. Electron Device letters, Jan. 1988, pp. 28–31.

Wheatley et al.: "COMFET—The Ultimate Poer Device; A General Study of Power Devices" Solid State Technology—Nov. 1985, pp. 121–128 (see appln p. 15).

"Nikkei Electronics", May 19, 1986—pp. 165–188 (see appln p. 2).

A. S. Grove, "Physics and Technology of Semiconductor Devices", John Wiley & Sons, University of California, Berkeley, Calif. 1967, pp. 288, 233.

Primary Examiner—Gene M. Munson
Attorney, Agent, or Firm—Cushman Darby & Cushman

[57] ABSTRACT

Arsenic is diffused previously on a most outside surface of a n$^-$-type epitaxial layer (2), and after forming gate oxide films (3) and gate electrodes (4), p-type base regions (8) and n$^+$-type source layers (7) are formed in a self-aligned manner with the gate electrodes (4) by a DSA technique and double diffusion. Thereby, a lateral directional junction depth of the p-type base regions (8) is compensated at the most outside surface, and a channel length of channels (9) is shortened substantially. When designing a threshold voltage, an impurity density of the p-type base regions (8) can be set higher than that of the conventional device by an amount corresponding to an impurity density of the arsenic of the most outside surface, and p-type pinch layers (14) formed underneath the n$^+$-type source layers (7) of the p-type base regions are (8) are lowered correspondingly in resistance.

30 Claims, 14 Drawing Sheets

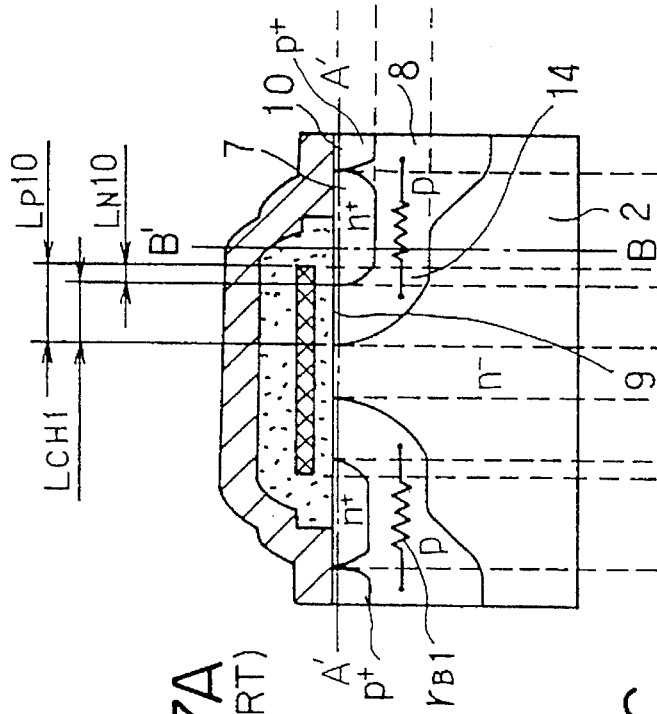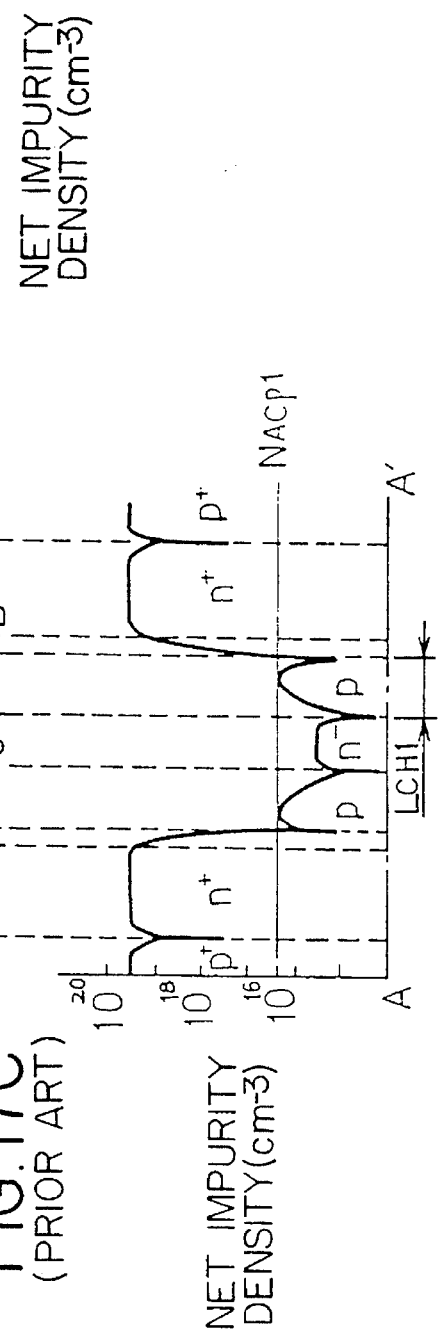
FIG. 17A (PRIOR ART)
FIG. 17B (PRIOR ART)
FIG. 17C (PRIOR ART)

VERTICAL TYPE INSULATED-GATE SEMICONDUCTOR DEVICE

FIELD OF THE INVENTION

The present invention relates to vertical type insulated-gate semiconductor devices used as power semiconductor elements and a method of producing the same, those of which are suitably employed for integration elements and the like made into unitary configurations together with a signal processing section using a unit thereof or the vertical type insulated-gate semiconductor device as a part thereof.

DESCRIPTION OF RELATED ART

Typical examples of vertical type insulated-gate semiconductor devices include power MOSFETs and insulated- gate bipolar transistors (IGBT) which are characterized by being driven at lower power. The power MOSFET has a rapid switching speed and the IGBT exhibits a lower loss even under a high withstand voltage, both of which features the foregoing and other various properties have widely been utilized in various industrial fields in recent years.

For example, "Nikkei Electronics" published by Nikkei McGraw-Hill Co., May 19, 1986, pp. 1–188 describes that a target of the development and research of the vertical insulated-gate semi-conductor devices is transferred to products with a low withstand voltage and a high withstand voltage, and in particular it mainly describes a vertical type insulated-gate semiconductor device with DMOS type (double diffusion type) based on a planer process exhibiting a high yield point and lower production cost.

Further, this reference teaches a continuous effort intended for reduction of a channel resistance which is a main component of an ON-state resistance with respect to the power MOSFET now mainly under development and research at a withstand voltage of equal to or less than 100 V, and further describes that such reduction has reached an ON-state resistance to an extent of 10 mΩ. This results from shortening of a channel length, application of a fine machining technique for production of the power MOSFET, and an expansion of a channel width per unit area by an improvement of a cell configuration, and like countermeasures. Moreover, in the IGBT which is mainly under development and research at a stand voltage of equal to or more than 100 V, it is described that an effort is being continued for raising a controllable maximum current value by interrupting a parasitic operation of an NPN transistor that may be a cause of latch-up. The method described includes various approaches; namely, assembling an $n^+$-type buffer layer; introduction of a life time killer; and reduction of a voltage drop in a lateral direction within a p-type pinch layer in such a way that a positive hole current flowing into a p-type base layer is decreased by an improvement of the cell configuration; and other like arrangements.

In recent years, less loss and less cost are more in demand by being accompanied with the spread in popularity of the power MOSFETs, however, the channel length shortening due changing a forming condition of the double diffusion layer faces a limit of around 1 µm because of existing problems of the lowered withstand voltage and the increased dispersion, while the reduction of the ON-state resistance obtained by the fine machining technique and the cell shaping improvement reaches a limited state. For example, according to Japanese Patent Application Laid Open SHO-63-266882 (1988), it is widely known that the DMOS type has a minimum point where the ON-state resistance is no longer decreased even by reducing a size of a unit cell by the fine machining technique, and its main cause resides in a sudden increase of a JFET resistance which is a component of the ON-state resistance. A size of the DMOS unit cell, on which the state resistance takes the minimum point, is equal to around 15 µm under the present fine machining technique as disclosed in Japanese Patent Application Laid Open HEI-02-86136 (1990).

On the other hand, less loss and less cost are required more even in the IGBT as is the case of the power MOSFET, the conventional method described above, where the controllable maximum current value is made higher, often makes these characteristics sacrifice. From among these, the conventional method in which a less-loss policy is not sacrificed is proposed in Japanese Patent Application Laid Open SHO-60-196974 (1985), which is shown in FIG. 22. This method is that a layer 15 having a high content of impurity is provided in a pinch layer underneath a source layer 7 within a p-type base layer 8 and a voltage drop value is reduced by lowering a resistance $r_{B3}$ in a lateral direction of the p-type pinch layer to improve the controllable maximum current value of the IGBT. However, although this method does not sacrifice the less-loss policy as compared to the assembly of the buffer layer or the introduction of the life time killer and the like, the ON-state resistance is not reduced effectively. In addition, formation and arrangement control of a high impurity content layer 15 adversely provide complexity of the production process with a higher cost, thus preventing suitability for its practical use.

Next, the construction of the vertical type insulated-gate semiconductor device of a general DMOS type and a method of producing such device are described as undermentioned.

FIG. 9 is a view of a vertical type insulated-gate semiconductor device 21 of the conventional basic DMOS type, where the view corresponds to a power MOSFET 22 an $n^+$-type of semiconductor substrate 1 and to a IGBT 23 for a $p^+$-type of semiconductor substrate 1 respectively. Next, in an example of the power MOSFET 22, a method of producing the vertical type insulated-gate semiconductor device 21 shown in FIG. 9 is described with reference to sectional views including its main producing processes of FIGS. 12 to 15 and FIG. 9.

In this power MOSFET 22, first as shown in FIG. 12 there is prepared a wafer 20 in which an epitaxial layer 2 formed of $n^-$-type silicon is provided on a main surface of a semiconductor substrate 1 formed of $n^+$-type monocrystalline silicon. As shown in FIG. 13, an oxide film 50 is formed on a main surface of the wafer 20 by thermal oxidation, boron is diffused by selected ion injection and thermal diffusion, and a deep p-well 60 is formed.

Following this, after removing the oxide film 50, as shown in FIG. 14 the thermal oxidation is performed on the main surface of the wafer 20 to form a gate oxide film 3, on which there forms a polysilicon film, which is further made into gate electrodes 4 by patterning so that the polysilicon remains a part thereof in a central portion apart at equal distances from two deep p-wells 60 in adjacent with each other. Boron is diffused to form a p- well 61 by the selected ion injection and thermal diffusion using the gate electrode 4 as a mask, simultaneously the p-well 61 and the deep p-well 60 are overlapped with each other to produce one composite p-well 62. In this regard, the p-well 61 is diffused in the lateral direction toward an inside from each end portion of the gate electrodes 4 to give it a junction depth of $L_{p1}$ in the lateral direction, and formation of the composite p-well 62 provides a drift region 6 formed within the epitaxial layer 2.

As shown in FIG. 15 in the main surface of the wafer 20, phosphorus is diffused by the selected ion injection and thermal diffusion using the gate electrodes 4 and a resist film (not shown) as a mask to form $n^+$-type source layers 7. At the same time, a channel 9 is formed and the so-called DSA (Diffusion Self Alignment) technique and the double diffusion. Then, diffusion is promoted in the p-well 61 in the lateral direction toward the inside from the end portion of the gate electrode 4 to increase a junction depth in the lateral direction up to $L_{p10}$. On the other hand, $n^+$-type source layers 7 are diffused in the lateral direction toward an inside from each end portion of the gate electrodes 4 to give a junction depth $L_{N10}$ in the lateral direction. Consequently, a channel length $L_{CH1}$ of the channel 9 is satisfied by the following equation, $$L_{CH1}=L_{P10}-L_{N10} \quad (1)$$

At this time, a p-type base layer 8, i.e., a region, in which the $n^+$-type source layer 7 is removed from the composite p-well 62, is formed. The p-type base layer 8 includes both a p-type pinch layer 14 that is a part of p-well 61 and a bottom portion of the p-well 60.

As shown in FIG. 9 in the main surface of the wafer 20, boron is diffused on a surface of a central portion of the p-type base layer 8 by the selected ion injection and thermal diffusion using resist film (not shown) as a mask to form $p^+$-type base contact layers 10. Following this, the main surface of the wafer 20 is formed of both layer-to-layer insulating films 11 which are holed for exposing each part of the n+-type source layers 7 and the $p^+$-type base contact layers 10. A source electrode 12 made of aluminum and the like is formed in ohmic-contact with the $n^+$-type source layers 7 and the $p^+$-type base contact layers 10 are formed on the main surface of the wafer 20 to form a surface protecting film (not shown). A drain electrode in 13 in ohmic-contact with the $n^+$-type substrate 1 and, for example, made of Ti/Ni/Au and the like is formed on a rear surface of the semiconductor substrate 1 to produce the power MOSFET 22 of the DMOS structure. In the above, a method of producing the power MOSFET 22 using $n^+$-type for the semiconductor substrate 1 has been described. However, the same method is employed for producing the IGBT 23 using $p^+$-type for the semiconductor substrate 1.

To describe in detail the channel portion and the structure of the vicinity thereof, FIGS. 17A to 17C show a partially enlarged view centered a portion of the Channel 9 from among a sectional view shown in FIG. 9 with respect to the conventional DMOS type of vertical insulated-gate semiconductor device 21. In addition, FIGS. 17A to 17C show both a net amount of impurity density distribution in the lateral direction along line A–A' of a surface of the $n^-$-type epitaxial layer 2, (hereinafter, an absolute value of difference between an acceptor impurity density and a donor impurity density is defined as a net impurity density, and such definition is further made as a net acceptor impurity density in a case where the acceptor impurity density is higher than the donor impurity density made as a net donor impurity density in case of vice versa) and a net amount of vertical impurity density distribution in the vertical direction along line B–B' intervening the p-type pinch layer 14 forming a part of the $n^+$-type source layer 7 and the p-type base layer 8.

A channel length of $L^{CH1}$ of the channel 9 formed by the DSA technique and the double diffusion (for example, 1 μm)

is given of a difference of respective junction depths of $L_{P10}$ and $L_{N10}$ of the diffusions in lateral directions with respect to both of the p-well 61 and the $n^+$-type source layer 7 as shown in the equation (1). The net impurity density along line A–A' as shown in 17A, which suddenly varies at a portion of the channel 9, takes a maximum net acceptor impurity density $N_{ACP1}$ at a certain position within the channel 9 to show a distribution profile protruding upwardly. On the other hand, the net impurity density along line B–B', which suddenly varies at a portion of the p-type pinch layer 14, takes a net maximum acceptor impurity density $N_{APP1}$ at a certain position within the p-type pinch layer 14 to show a distribution profile protruding upwardly.

Here, in the diffusion layer of the n-channel type vertical insulated-gate semiconductor device formed by the DSA technique and the double diffusion, it is found that a linear relationship as shown in FIG. 18 is experimentally established between the net maximum acceptor impurity density $N^{ACP}$ within the channel and a net maximum acceptor impurity density $N_{APP}$ within the p-type pinch layer, which are given by the following equation (2), $$N_{AC9}=(1/5) \cdot N_{APP} \quad (2)$$

In the equation (2), a reason why $N_{ACP}$ is smaller than $N_{APP}$ resides in that $N_{ACP}$ is regulated by the lateral directional diffusion to be two-dimensionally diffused and yet such lateral directional diffusion is affected by a segregation phenomenon at a boundary face of the silicon and a gate oxide film, while $N_{AP}$ is regulated by one-dimensional vertical diffusion.

A threshold voltage $V_{TH}$ defined by a gate voltage of the time when the vertical insulated-gate semiconductor device is turned ON, is apparently equal to a condition that the channel is turned ON. Also because the threshold voltage $V_{TH}$ is equal to a gate voltage of the time when an inverted state starts at a boundary face of a MOS capacitor, then referring to A. S. Grove, "Physics and Technology of Semiconductor Devices" (published by John Wiley and Sons in 1967) 288, page 333, the threshold voltage $V_{TH}$ in case of taking a p-type for silicon is given by the following equation, $$V_{TH}=(4K_s\epsilon_0qN_A\phi_{Fp})^{1/2}\times((t_{OX}/(K_0\epsilon_0))+2\phi_{Fp}+V_{FB} \quad (3)$$

where in the equation (3) $K_s$ represents a specific dielectric of silicon, $\epsilon_0$ a dielectric of vacuum, q an elementary quantity of electric charge, $N_A$ a net acceptor impurity density within silicon, $\phi F_p$ Fermi potential in the silicon, $t_{ox}$ a thickness of the gate oxide film, $K_0$ a specific dielectric of the oxide film, and $V_{FB}$ a flat band voltage.

A relationship between the threshold voltage $V_{TH}$ obtained by substituting each parameter into the equation (3) and the net acceptor impurity density $N_A$ in silicon is shown in FIG. 19, where the thickness $t_{ox}$ of the gate oxide film is 100 nm and the $n^+$-type polysilicon is used as a gate electrode. From the operating condition of the vertical insulated-gate semiconductor device, assume that the threshold voltage $V_{TH}$ is, for example, equal to 2 V, which corresponds to point A in FIG. 19, $N_A$ is required to be set $2\times10^{16}$ $cm^{-3}$, $$V_{TH}=2[V] \quad (4)$$

$$N_A=2\times10^{16}[cm^{-3}] \quad (5)$$

Here, assume that the net maximum acceptor impurity density $N_{ACP}$ within the channel in FIG. 18 and the net acceptor impurity density $N_A$ within silicon in FIG. 19 are equal to each other, B point in FIG. 18 corresponds to A point in FIG. 19, $$N_{ACP} = N_A \quad (6)$$

In FIG. 18, when $N_{ACP}$ is $2 \times 10^{16} cm_{-3}$, the net maximum acceptor impurity density $N_{APP}$ with the p-type pinch layer is $1 \times 10^{17}$ cm$^{-3}$ from equation (2), $$N_{APP} = 1 \times 10^{17} cm_{-3} \quad (7)$$

In this way, as described in the equations (4) to (7) referring to FIGS. 18 and 19, in the vertical insulated-gate semiconductor device produced by the conventional DSA technique and double diffusion, both the threshold voltage $V_{TH}$ and the net maximum acceptor impurity density $N_{APP}$ within the p-type pinch layer are in a relationship of a dependent variables to each other, and are not set independently from the other. A relationship as shown in FIG. 20 is provided between the net maximum acceptor impurity density $N_{APP}$ in the p-type pinch layer and a resistance $r_B$ in the lateral direction of the p-type pinch layer per unit cell. FIG. 20 shows the relationship assuming that a shape of a unit cell is a square shaped cell having each edge of 15 μm, a thickness of the p-type pinch layer is 2 μm, and a length between the end portion of diffusion in the lateral direction of the p-type pinch layer and a lower portion of the p$^+$-type base contact layer is 4 μm. Therefore, as is apparent from FIGS. 18, 19, and 20, $V_{TH}$ and $r_B$ also are not set independently from the other.

In the case where the contents described with reference to FIGS. 18, 19, and 20 are applied to the vertical insulated-gate semiconductor device 21 shown in FIGS. 9 and 17, then it is required that, to suppress the threshold voltage $V_{TH}$, to as low as an extent of 2 V, as shown in equation (4) to (7) the p-type base layer 8 must be made up so that the net maximum acceptor impurity density $N_{APP1}$ within the p-type pinch layer 14 is set to $1 \times 10^{17} cm^{-3}$. This value corresponds to E point in FIG. 20, a resistance $r_{B1}$ in the lateral direction of the p-type pinch layer 14 per unit cell is set to as high as 442 Ω, $$r_{B1} = 442 [\Omega/cell] \quad (8)$$

An object of the present invention in the application, in the vertical insulated-gate semiconductor device produced by the DSA technique and double diffusion, is to provide a vertical insulated-gate semiconductor device and a method of producing such device capable of effectively reducing an ON-state resistance simultaneously satisfying two conditions being contrary each other, namely, suppressing the threshold voltage $V_{TH}$ to be lower, and simultaneously, reducing the resistance $r_B$ in the lateral direction of the pinch layer formed by double diffusion.

Next, the power MOSFET and IGBT are described separately in detail.

First, the power MOSFET 22 using an n$^+$-type semiconductor substrate 1 in the vertical type insulated- gate semiconductor device 21 in FIG. 9 is described now referring to FIG. 10. The ON-state resistance $r_{ON}$ of the power MOSFET 22 is given as a sum of main resistance components as shown in the following equation, $$r_{ON} r_{CH1} + r_{AN1} + r_{JFET} + r_{SUB} \quad (9),$$

where, in equation (9), $r_{CH1}$ represents a channel resistance, $r_{AN1}$ a distribution resistance formed of an accumulation layer and a neck portion, $r_{JFET}$ a JFET resistance, and $r_{SUB}$ a substrate resistance. A ratio of these resistance components versus the ON-state resistance is largely varied with a condition of a breakdown voltage. For example, C. Frank Wheatley and Gary M. Dolny, "COMFET - The Ultimate Power Device; A General Study of Power Devices" published in "Solid State Technology" November 1985, p. 121 to 128 describes a relationship between a breakdown voltage $BV_{DSS}$ and a characteristic ON-state resistance $R_{ONS}$ and main resistance components thereof in a power MOSFET of DMOS structure, where a graphical representation showing such relationship is introduced in FIG. 21. As is apparent from FIG. 21, the channel resistance $r_{CH}$ comes particularly dominant under the condition of a voltage equal to or less than 100 V.

In the power MOSFET in the main target of research and development in a withstand voltage of equal to or less than 100 V, a switching application using a reverse conducting diode automatically incorporated between its drain and source is introduced into a PWM control, however in this case, a problem arisen in transferring from the reverse conducting state to the forward conducting state. A phenomenon arising in this case is explained referring to FIG. 10. A positive hole flows into the p-type pinch layer 14 to flow through the resistance $r_{B1}$ in the lateral direction and to produce a voltage drop of $V_{B1}$. Conventionally, if the threshold voltage $V_{TH}$, intends to be suppressed to a lower value, the resistance $r_{B1}$ in the lateral direction of the pinch layer 14 becomes higher and the voltage drop VB1 comes larger. With the voltage drop $V_{B1}$ being thus higher, a parasitic n-p-n transistor formed of n$^-$-type epitaxial layer 2 - p-type base layer 8 -n$^+$-type source layer 7 is turned ON, thereby a large current flows between the drain and the source, hence a problem occurs in breakage of the power MOSFET 22.

An object of the present invention, in case of the power MOSFET as a vertical insulated-gate semiconductor device, is to reduce the channel resistance $r_{CH}$ and to effectively lower the ON-state resistance together with preventing damages due to the ON-state operation of the parasitic n-p-n transistor in switching by reducing the lateral direction resistance of the pinch layer even when the threshold voltage is suppressed to lower value.

The IGBT 23, in which the semiconductor substrate 1 in the vertical type insulated-gate semiconductor device 21 shown in FIG. 9 is p$^+$-type, is described referring to FIG. 11. A main factor for determining the controllable maximum current value of the IGBT 23 is a voltage drop VB1 generated from a positive hole $i_{B1}$ (shown by a flow path 71) flowing into the resistance $r_{B1}$ in the lateral direction of the p-type pinch layer 14, and $V_{B1}$ forwardly biases a diode 73 formed on a junction of the p-type base layer 8 with the n+-type source layer 7. When VB1 comes sufficiently larger to conduct the diode 73, a parasitic p-n-p-n type thyristor composed of p$^+$-type substrate 1 - n$^-$-type epitaxial layer 2 -p-type, base layer 8 - n$^+$-type source layer 7 is turned ON, thereby latch-up is generated, where a latch-up current value $I_L$ is obtained as undermentioned.

In the square shaped cell with each edge of 15 μm, a condition for generating the latch-up is equal to the condition of conducting in the forward direction of the diode 73 in FIG. 11. For example, a forward directional voltage at 150° C. is about 0.3 V, and the latch-up is generated when the voltage drop VB1 reaches 0.3 V.

$$V_{B1} = 0.3 [V] \quad (10)$$

In this case, the positive hole current $i_{B1}$ per cell flowing into the lateral directional resistance $r_{B1}$ of p-type pinch layer 14 is as shown in the equations (9) and (10) as undermentioned.

$$i_{B1} = V_{B1}/r_{B1} = 0.3[V]/442[\Omega] \quad (11)$$
$$= 6.79 \times 10^{-4}[A]$$

Here, the square shaped cells with each edge of 15 μm are integrated in the number of $4.44 \times 10^5$ per cm$^2$, consequently the positive hole current $I_{B1}$ per cm$^2$ flowing into the lateral directional resistance or the p-type pinch layer is given by the equation (12).

$$I_{B1} = i_{B1} \times 4.44 \times 10^5 \doteq 301 \; [A/cm^2] \quad (12)$$

A drain current $I_D$ of the IGBT 23 is given of a sum of an electron current $I_E$ shown by a flow patch 70, the positive hole current $I_{B1}$ flowing in the lateral direction of the p-type pinch layer shown by a flow patch 71, and the positive hole current $I_{W1}$ flowing-in from a bottom surface of the p-type base layer shown by a flow path 72, that is, $I_D = I_E + I_{B1} + I_{W1}$ is established. $I_{B1} \doteq I_{W1}$ is experimentally known, and as a consequence, $$I_D = I_E + 2 \times I_{B1} \quad (13)$$

Assume a collector current of $2 \times I_{B1}$ of the p-n-p transistor formed in the vertical direction and a current gain $h_{FE}$ of 3 because of given base current of $I_E$, then the latch-up current value $I_L$ corresponding to the drain current at the time of latch-up is obtained from the equations (12) and (13) and the following equation is satisfied, $$I_L \doteq 800 \; [A/cm^2] \quad (14)$$

where $I_L$ results in determining a controllable maximum current value. Practically, the current does not flow uniformly on an entire surface of the IGBT chip, accordingly, a practical latch-up current value is smaller compared to the value shown by the equation (14).

To avoid this problem, under the condition that a sufficiently smaller VB1 is preferable even if the drain current is increased, it is effective to reduce the lateral directional resistance rB1 of the p-type pinch layer 14 or to reduce the positive hole current. A reduction of the positive hole current allows the ON-state resistance of the IGBT to increase and to sacrifice its characteristic. However, the reduction of the lateral reductional resistance rB1 of the p-type pinch layer 14, itself does not produce a direct problem such as an increase of the ON-state resistance and like drawbacks. However, to form the p-type pinch layer by using the double diffusion, the reduction of the lateral directional resistance rB1 of the p-type pinch layer 14 is intended, but this produces an indirect problem such as raising the threshold voltage as described above. For this reason, some countermeasures are required.

It is needless to say that the reduction of the channel resistance also effects the IGBT by reducing the ON-state resistance.

An object of the present invention, in case of the IGBT as a vertical insulated-gate semiconductor device, is to reduce the channel resistance $r_{CH}$ and to effectively lower the ON-state resistance together with raising the controllable maximum current value by making the lateral directional resistance of the pinch layer smaller even when the threshold voltage is suppressed to s lower value.

SUMMARY OF THE INVENTION

A vertical type insulated-gate semiconductor device and a method of producing the device according to the present invention, differs of a part thereof from the conventional one, wherein a basic concept is employed for reducing a lateral directional resistance of a pinch layer by increasing an amount of impurity diffusion than the conventional one so as to form the pinch layer at the time of double diffusion, for reducing a distribution resistance formed of an accumulating layer and a neck portion, and for reducing a threshold voltage by diffusing impurity of the same conduction type as a semiconductor layer onto a surface layer portion of the semiconductor layer including a channel in order to obtain independent control of both the threshold voltage and the lateral directional resistance of the pinch layer and to obtain a shortened channel length without receiving a conventional limitation of the condition of the double diffusion.

An impurity density distribution of the channel section is determined by three impurity diffusions; namely, a diffusion on a surface layer of a first conduction type; an impurity diffusion of a second conduction type for forming a base layer in the double diffusion; and an impurity diffusion of the first conduction type for forming a source layer. On the other hand, an impurity density distribution of the base layer is determined by two double diffusions.

Due to addition of the surface layer diffusion in this manner, the lateral directional diffusion of the second conduction type impurity for forming the base layer is compensated at the surface layer, and as a consequence, a lateral directional junction depth on the surface layer can be thinned thereby to shorten a channel length in spite of double diffusing deeply in the vertical direction and to reduce a channel resistance, and moreover the distribution resistance formed of the accumulation layer and the neck portion is also reduced. As a result, the ON-state resistance can be greatly decreased.

Even when the lateral directional resistance of the pinch layer is set to a lower value by increasing the amount of the second conduction type impurity forming the base layer in the double diffusion in comparison with the conventional one, then the threshold voltage can be suppressed to a lower value by lowering the maximum value of the net impurity density (a difference between the acceptor impurity density and the donor impurity density) of the channel section by diffusion of the surface layer portion. That is, even in suppressing the threshold voltage to a low value, the lateral directional resistance of the pinch layer can be reduced.

Accordingly, in the power MOSFET which is one profile of the vertical type insulated-gate semiconductor device according to the present invention, the reduction of the lateral directional resistance of the pinch layer interrupts the turn-ON of the parasitic transistor at the time of switching and prevents its breakage. Furthermore, in the IGBT which is another profile of the vertical type insulated-gate semiconductor device according to the present invention, similarly a turn-ON of the parasitic p-n-p-n thyristor is interrupted thereby to prevent breakage.

BRIEF DESCRIPTION OF THE DRAWINGS

FIG. 17 is a sectional view of essentials and a representation of a net impurity content with respect to the conventional vertical type insulated-gate semiconductor device;

DESCRIPTION OF PREFERRED EMBODIMENTS

Figure 9:
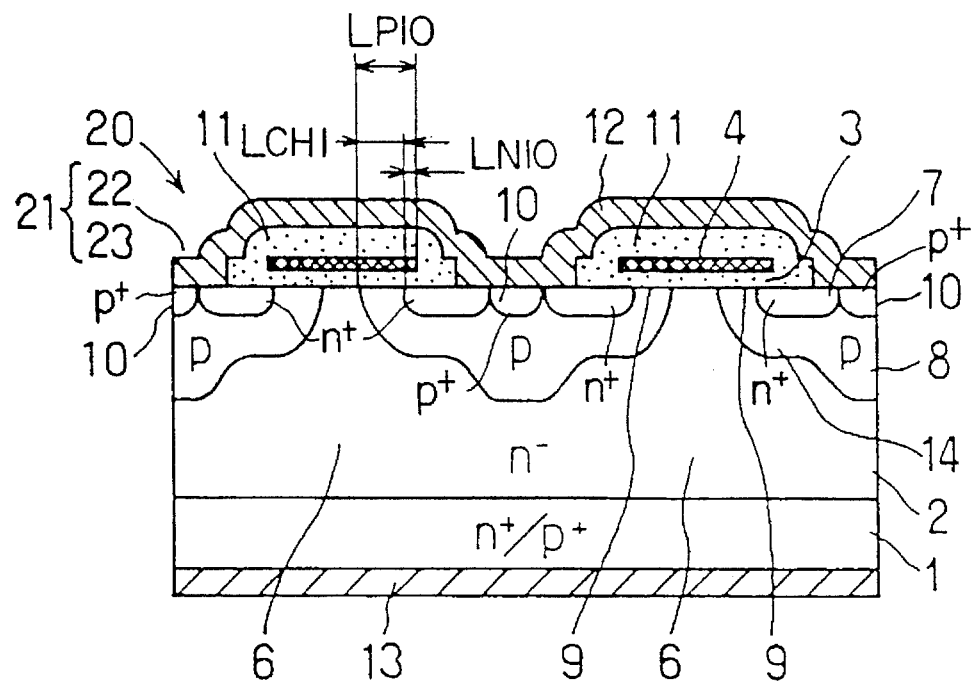
FIG. 9 is a sectional view of the conventional n-channel type of vertical type insulated-gate semiconductor device.
Figure 10:
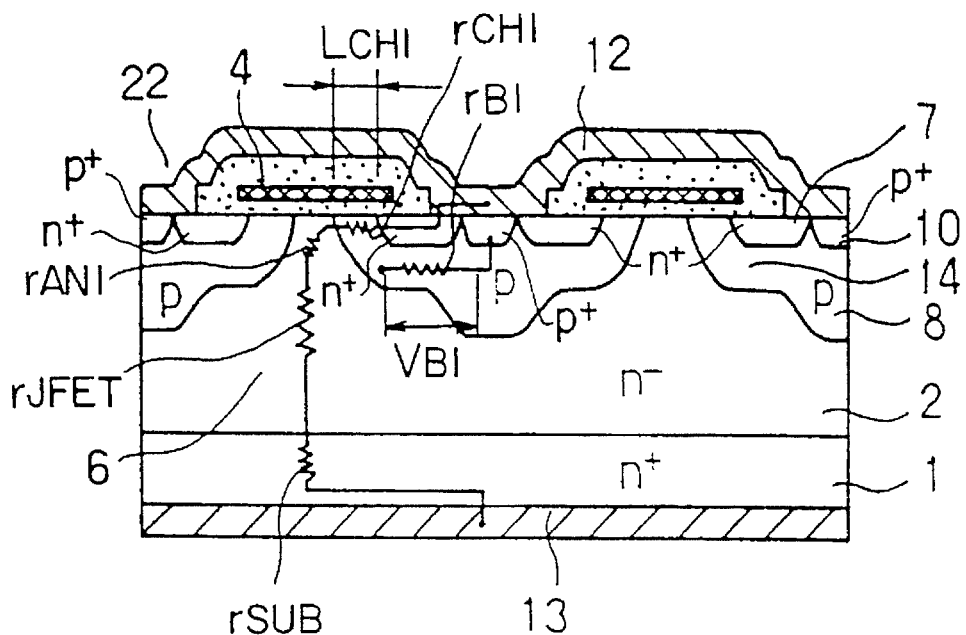
FIG. 10 is a sectional view illustrating the conventional power MOSFET.
Figure 11:
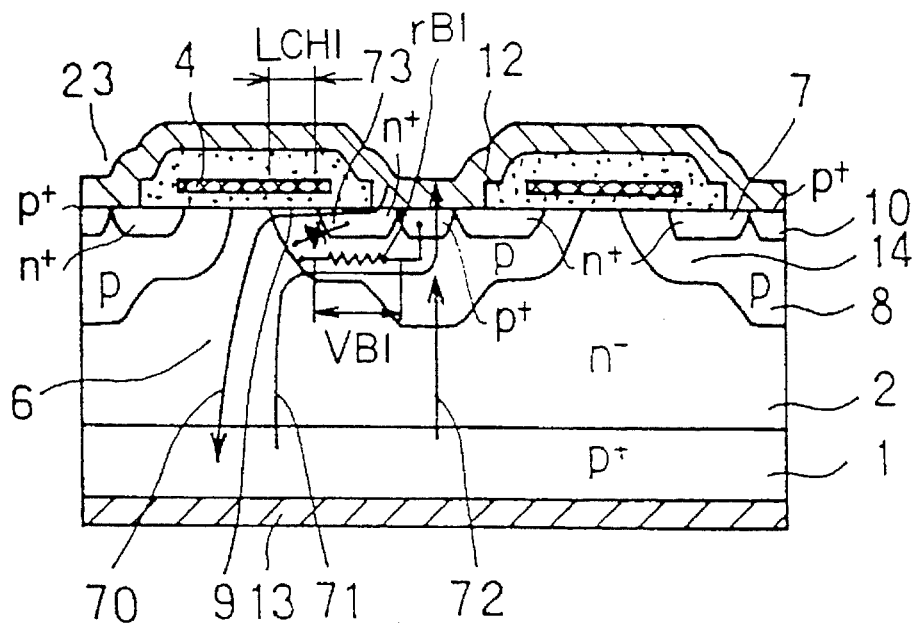
FIG. 11 is a sectional view illustrating the conventional IGBT.
Figure 12:
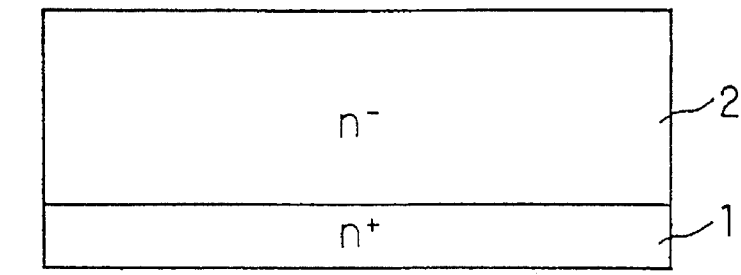
FIG. 12 is a sectional view illustrating the conventional production process of the power MOSFET.
Figure 13:
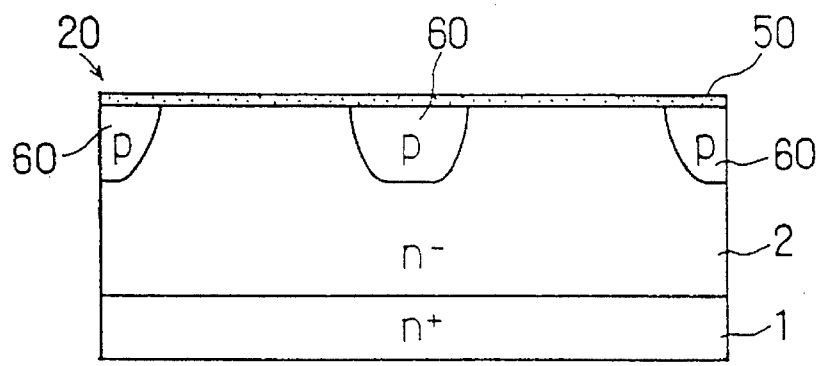
FIG. 13 is a sectional view illustrating the conventional production process of the power MOSFET.
Figure 14:
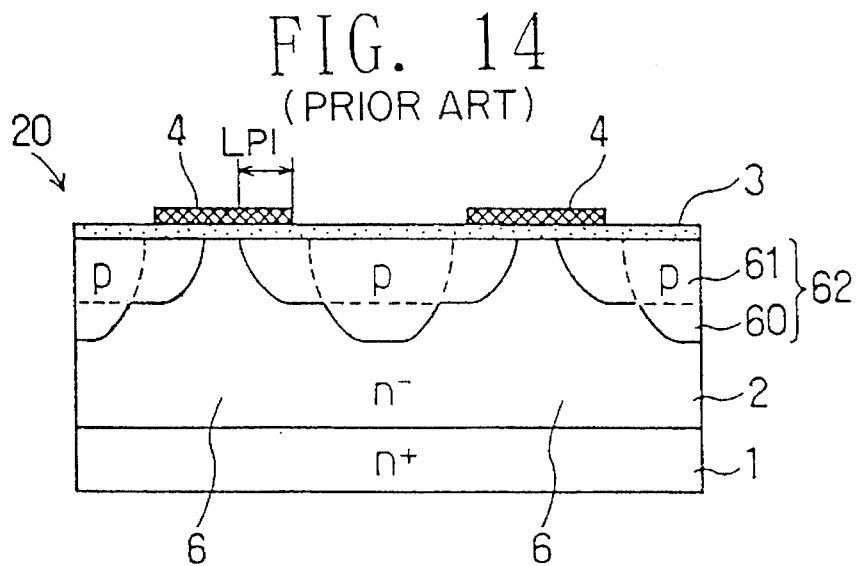
FIG. 14 is a sectional view illustrating the conventional production process of the MOSFET.
Figure 15:
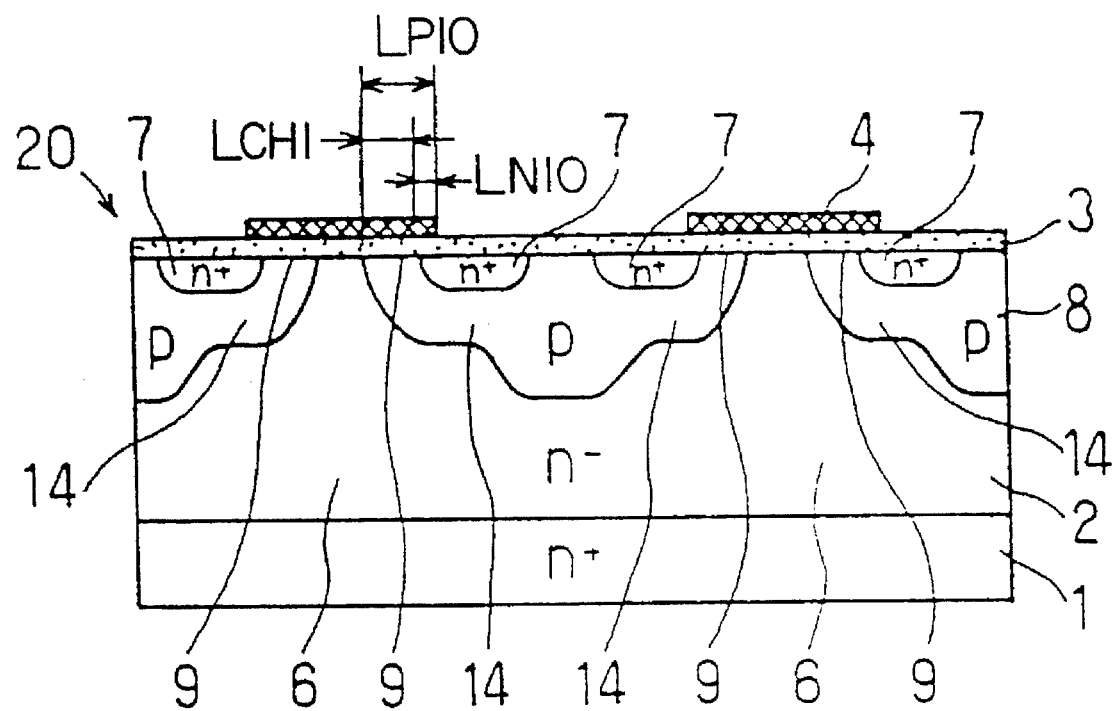
FIG. 15 is a sectional view illustrating the conventional production process of the power MOSFET.

An embodiment according to the present invention is described with reference to the drawings. The same reference numerals are given to the same parts as those described in FIG. 9 and others.

Figure 1:
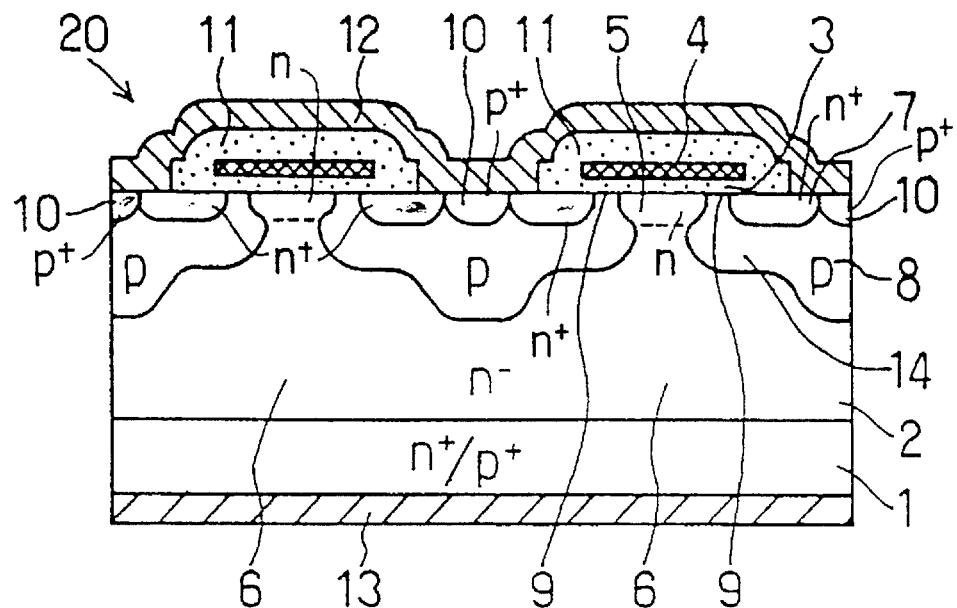
FIG. 1 is a sectional view of a vertical type insulated-gate semiconductor device of n-channel type applied to one embodiment according to the present invention.
Figure 2:
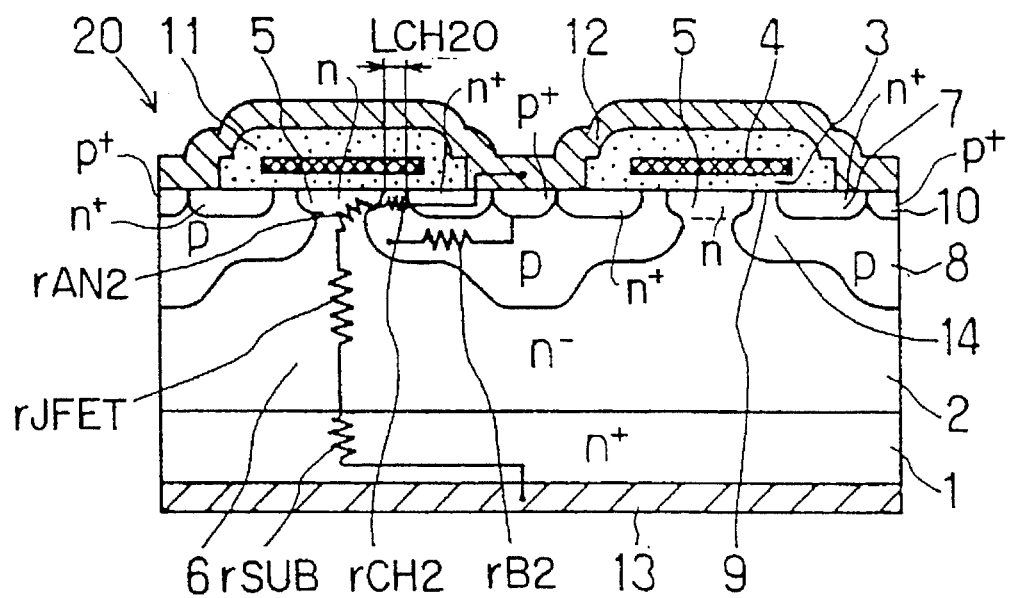
FIG. 2 is a sectional view illustrating a case where one embodiment is applied to a power MOSFET.
Figure 3:
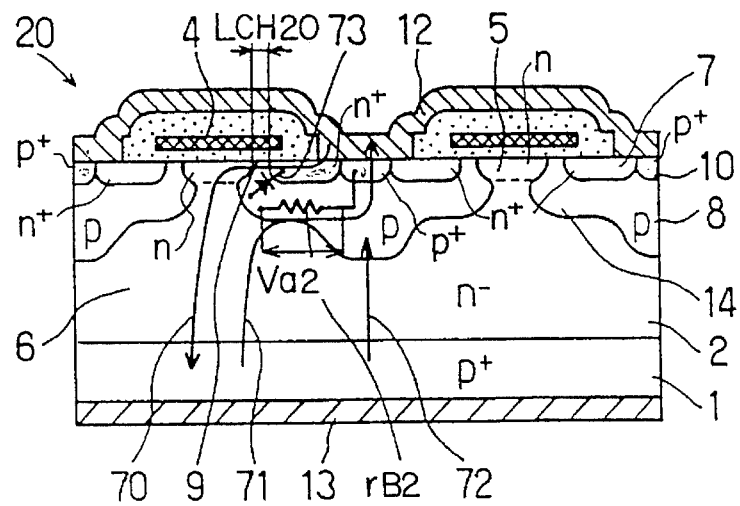
FIG. 3 is a sectional view illustrating a case where one embodiment is applied to an IGBT.

FIG. 1 is a sectional view of a vertical type insulated-gate semiconductor device of n-channel type according to one embodiment of the present invention, and in particular a power MOSFET in FIG. 1, which uses a $n^+$- type semiconductor substrate 1, is shown in FIG. 2, and an IGBT, which uses $p^+$-type for the semiconductor substrate 1, is shown in FIG. 3.

Figure 4:
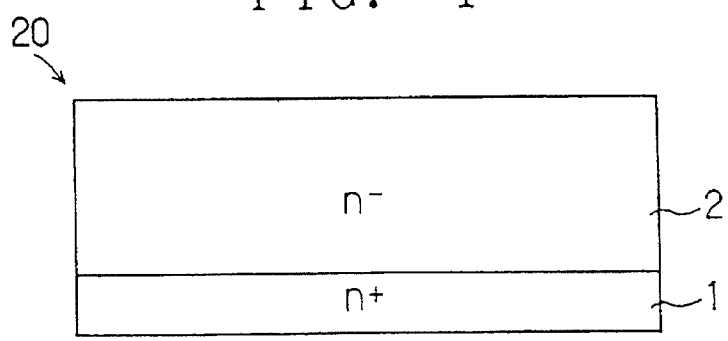
FIG. 4 is a sectional view illustrating a production process of a power MOSFET of one embodiment according to the present invention.
Figure 5:
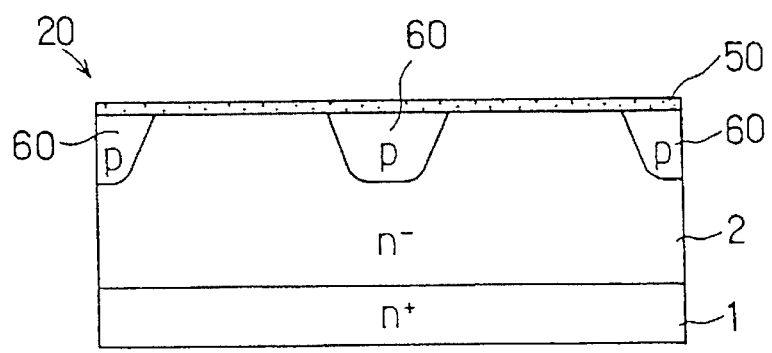
FIG. 5 is a sectional view illustrating a production process of a power MOSFET of one embodiment according to the present invention.
Figure 6:
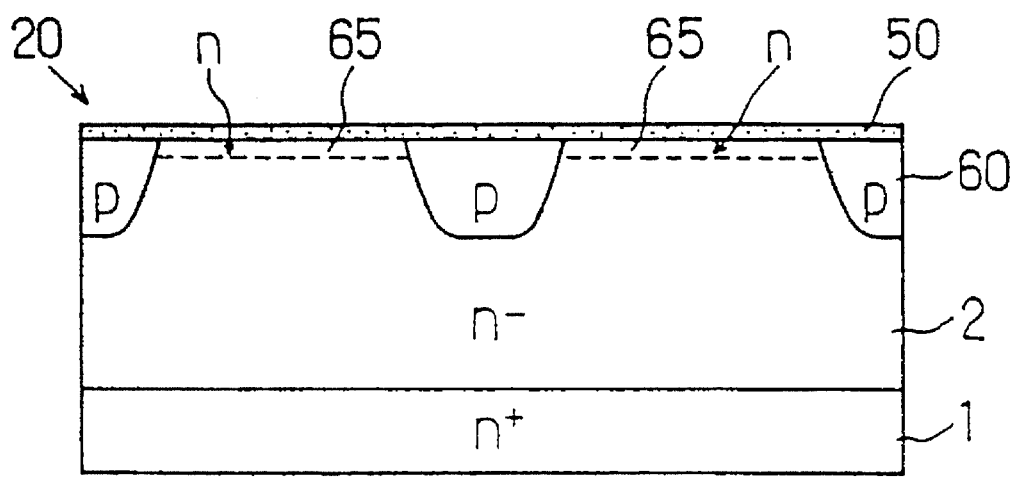
FIG. 6 is a sectional view illustrating a production process of a power MOSFET of one embodiment according to the present invention.
Figure 7:
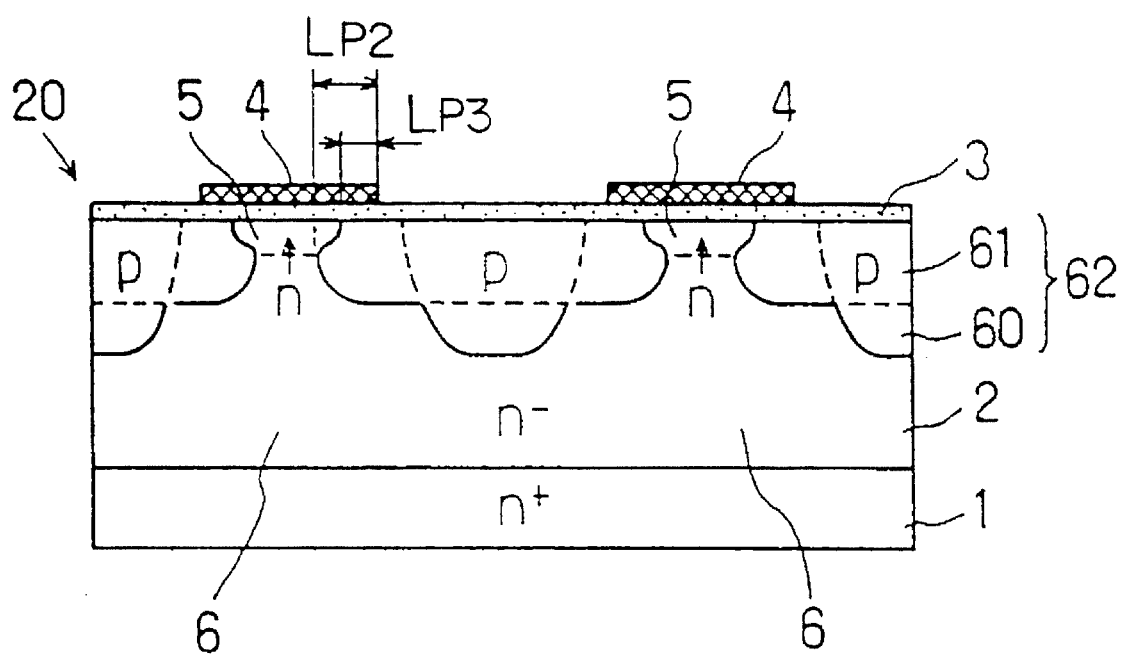
FIG. 7 is a sectional view illustrating a production process of a power MOSFET of one embodiment according to the present invention.
Figure 8:
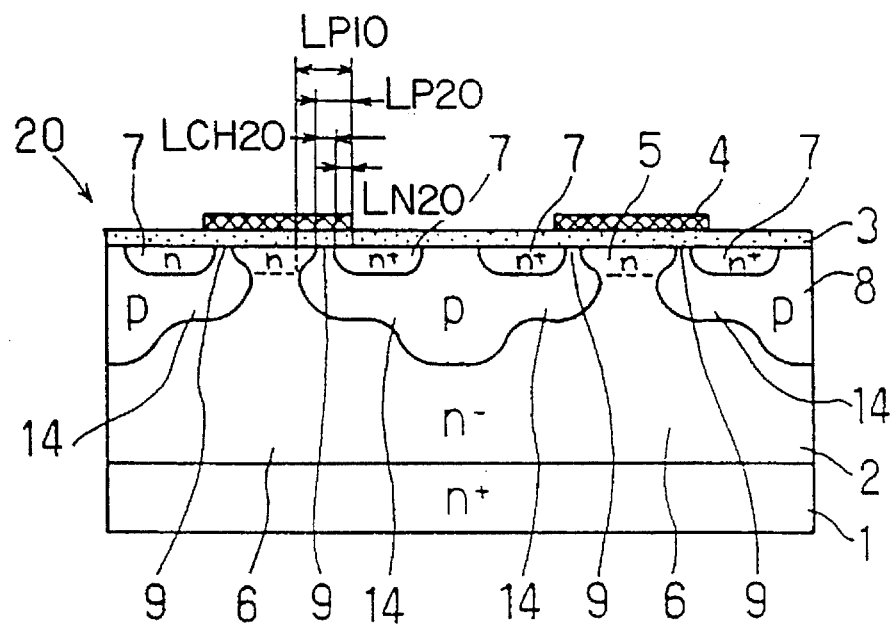
FIG. 8 is a sectional view illustrating a production process of a power MOSFET of one embodiment according to the present invention.

FIGS. 4 to 8 are sectional views of wafers 20, i.e., in process in individual main processing stages in the case of producing the power MOSFET shown in FIG. 2. FIG. 4 is a sectional view of a wafer using as a main surface a surface of a $n^-$-type epitaxial layer formed on $n^+$-type semiconductor substrate, FIG. 5 is a sectional view of a wafer formed of a deep p-well by selectively diffusing boron for forming a central portion of a p-type base layer, FIG. 6 is a sectional view of a wafer in which its main surface is formed of a gate oxide film and further a surface layer portion of the main surface is diffused with arsenic FIG. 7 is a sectional view of a wafer formed of a p-well by diffusing boron using a gate electrode formed on a gate oxide film as a mask, FIG. 8 is a sectional view of a wafer formed of a $n^+$-type source layer and simultaneously formed of a channel by diffusing phosphorus using a gate electrode as a mask, and FIG. 2 is a sectional view of a completed wafer formed of a layer-to-layer insulated film, a source electrode, and a drain electrode and diffusion of boron for forming a $p^+$-type base contact layer.

Figure 16B:
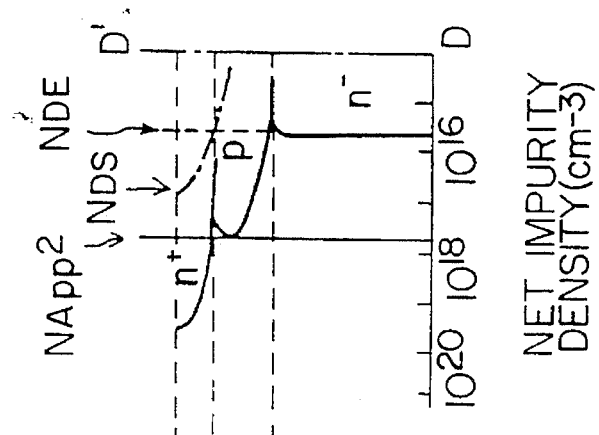
FIGS. 16A to 16C are sectional views of essentials and a representation of a net impurity content with respect to a vertical type insulated-gate semiconductor device according to the present invention.
Figure 16A:
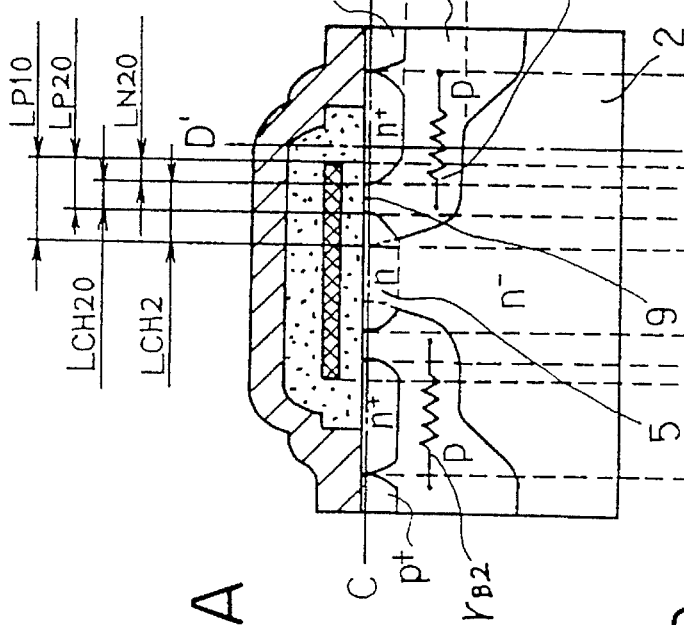
Figure 16C:
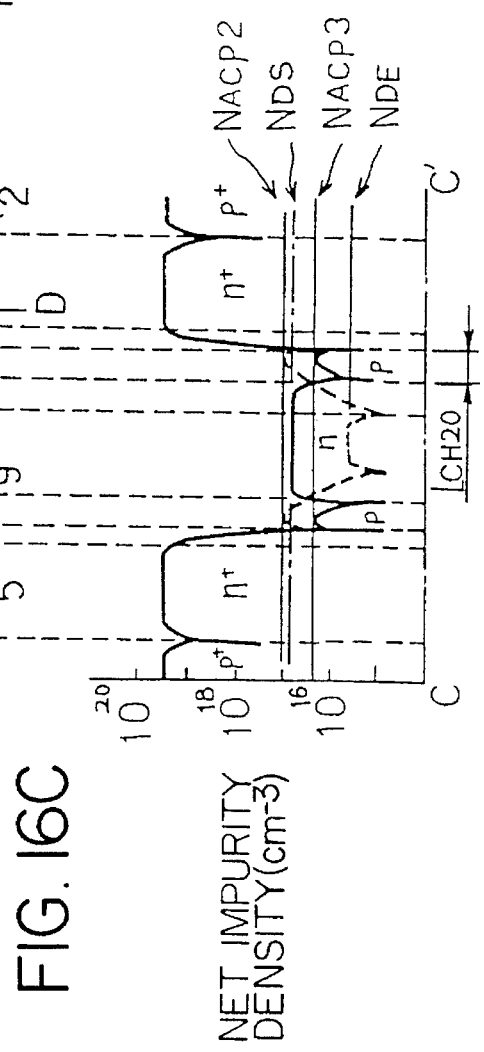

The vertical type insulated-gate semiconductor device of FIG. 1 is shown in FIG. 16 for its essential portions, i.e., a channel section, an accumulation layer and a neck portion, and a p-type pinch layer portion in a sectional view and an impurity density distribution.

The present embodiment is described using an example of a power MOSFET shown in FIG. 2.

In FIGS. 2 and 16A to 16C, a wafer 20 uses an arrangement that a $n^-$-type epitaxial layer 2 having an impurity density $N^{DE}$ of an extent of $5 \times 10^{15}$ cm$^{-3}$ with a thickness of around 7 μm is disposed on a semiconductor substrate 1 formed of a monocrystalline $n^+$-type silicon having an impurity density of an extent of $10^{20}$ cm$^{-3}$ with a thickness of 100 to 300 μm, and a square shaped unit cell with each edge of about 15 μm is arranged on a main surface of the wafer 20. Arsenic is diffused on the surface layer portion of the epitaxial layer 2 having a surface density $N_{DS}$ of $8 \times 10^{16}$ cm$^{-3}$ with a depth of about 0.5 μm from its surface. The surface of the epitaxial layer 2 is formed of a gate oxide film 3 of 50 to 100 nm by thermal oxidation, and the result is further formed thereon with gate electrodes 4 composed of polysilicon with a thickness of an extent of 400 nm.

Boron and phosphorus are diffused by a self aligned double diffusion using the gate electrodes 4 as a mask. This then forms p-type base layers 8 having a depth of an extent of 2.5 μm and $n^+$-type source layers 7 having a junction depth of an extent of 0.7 μm. In this connection, each bottom surface portion of-the p-type base layers 8 is previously mace to have a junction depth of an extent of as deep as 3 μm by the deep p-well diffusion. This setting is provided for producing a breakdown at the bottom surface port on of the p-type base layer 8 when a high voltage is applied across a drain and a source.

Layer-to-layer insulative films 11 composed of a BPSG with a thickness of an extent of 1 μm are formed on gate electrodes 4. Each $p^+$-type base contact layer 10 having a diffusion depth of an extent of 0.5 μm is formed on a surface of a central portion of the p-type base layer 8, and a source electrode 12 formed on the layer-to-layer insulative films 11 is in ohmic-contact with the $n^+$-type source layers 7 and the $p^+$-type base contact layers 10 through contact holes. A drain electrode 13 is formed on a rear surface of the semiconductor substrate 1 for ohmic-contact thereto.

Figure 18:
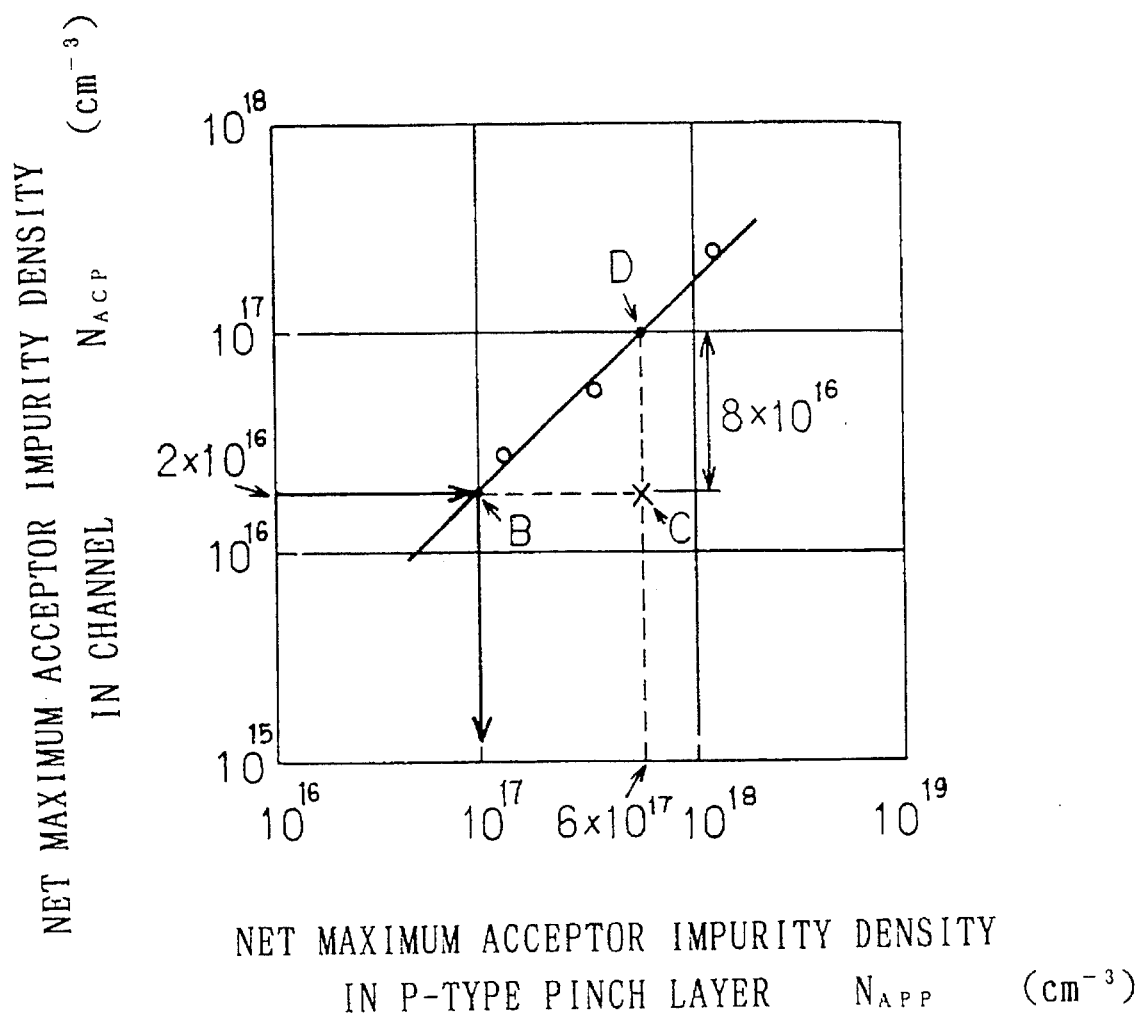
FIG. 18 is a representation of relationship of a net maximum acceptor impurity density within a p-type pinch layer versus a net maximum acceptor impurity density within a channel with respect to a vertical type insulated-gate semiconductor device.

In the power MOSFET of the present embodiment shown in FIGS. 2 and 16A to 16C described above, a p-type pinch layer 14 has a thickness of 1.8 Rm produced from a difference between the junction depths 2.5 µm of the p-type base layer 8 and 0.7 µm of the n⁺-type source layer 7 by the self aligned double diffusion using the gate electrodes as a mask, a net maximum impurity density $N_{APP2}$ is set to an extent of $6 \times 10^{17}$ cm⁻³, where this corresponds to point D in FIG. 18. Here in a channel 9, the junction depths $L_{P10}$ and $L_{N20}$ in the lateral directions of the p-type base layer 8 and the n⁺-type source layer 7 only by the self aligned double diffusion are 2.0 µm and 0.5 µm respectively, a channel length $L_{CH2}$ regulated therefrom becomes 1.5 µm that is a difference between such junction depths 2.0 µm and 0.5 µm. A net maximum impurity density $N_{ACP2}$ is set to an extent of $1 \times 10^{17}$ cm⁻³ (see the equation (2)), which corresponds to point D described in FIG. 18.

Figure 19:
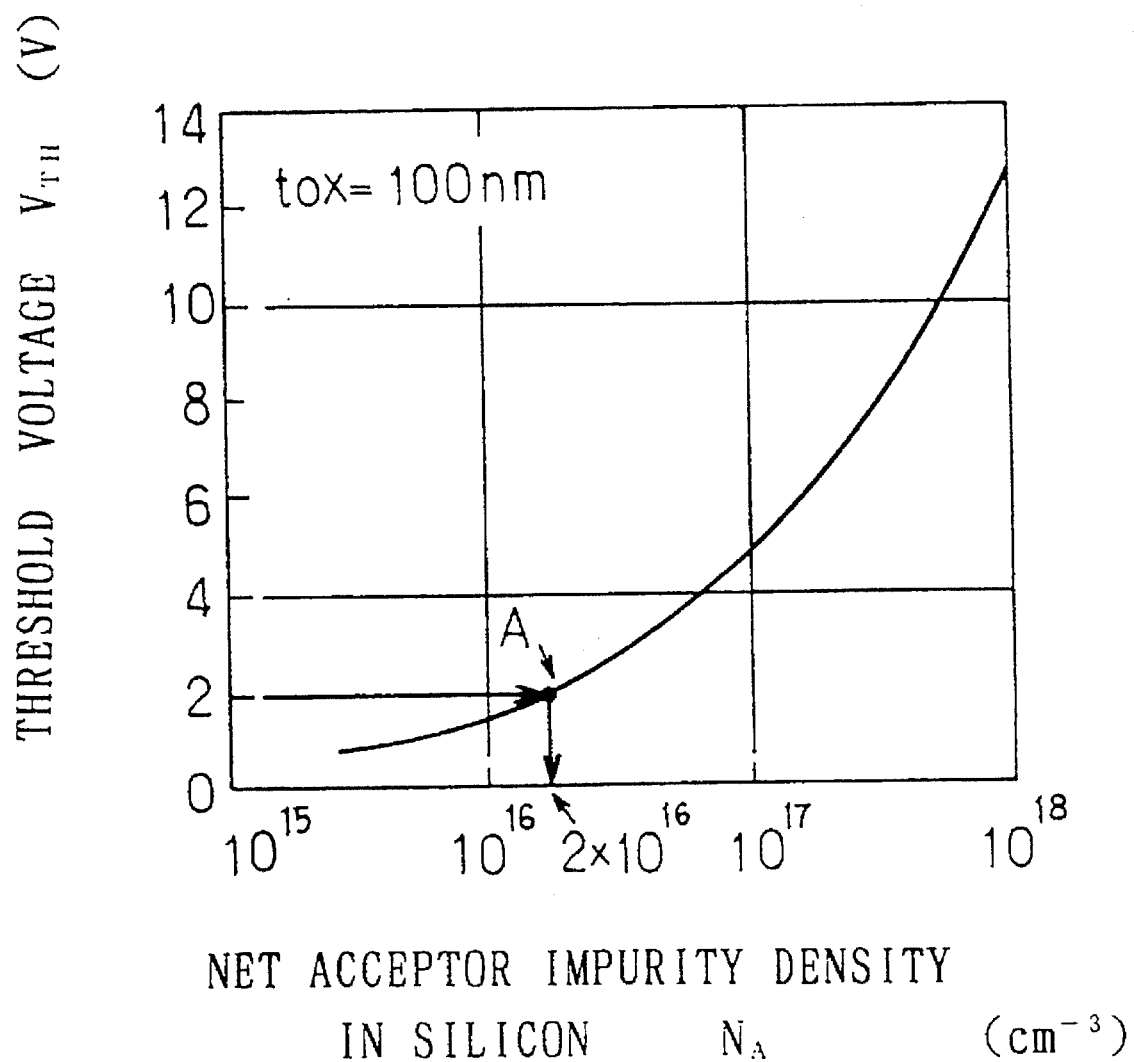
FIG. 19 is a representation of relationship of a threshold voltage versus a net maximum acceptor impurity density within silicon with respect to a vertical type insulated-gate semiconductor device.

However, in the surface layer portion where the channel 9 is set, because arsenic is diffused at a surface density of $N_{DS}$ (=$8 \times 10^{16}$ cm⁻³) by diffusion of a surface layer portion in addition to the self aligned double diffusion, a net maximum impurity density $N_{ACP3}$ is decreased to $2 \times 10^{16}$ cm⁻³ the difference between $N_{ACP2}$ ($1 \times 10^{17}$ cm⁻³) and $N_{DS}$ (=$8 \times 10^{16}$ cm⁻³), where point D is transferred to point C in FIG. 18. As a consequence, it is possible to set a threshold value $V_{TH}$ at as low as about 2 V lower than in FIG. 19.

Figure 20:
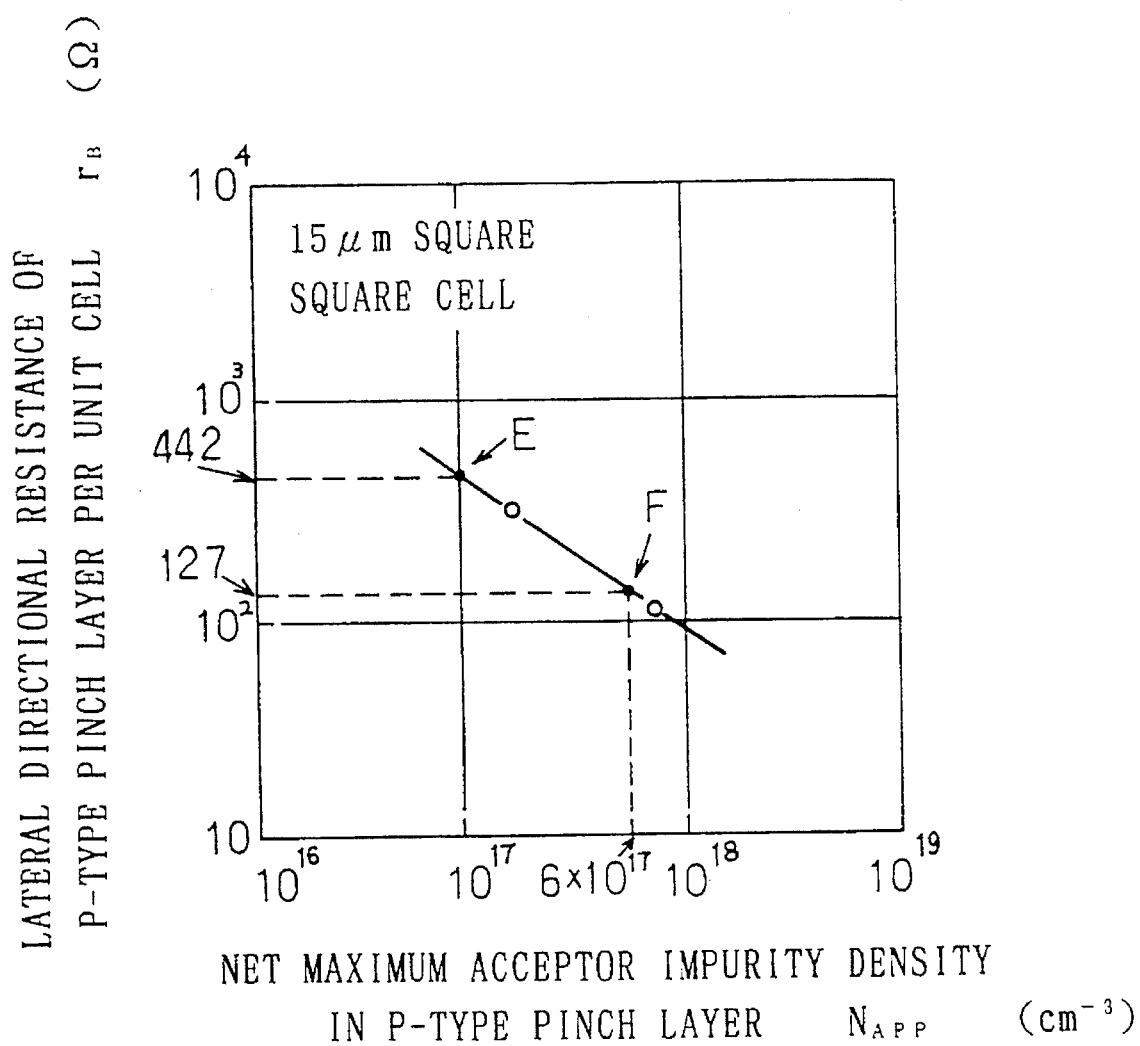
FIG. 20 is a representation of relationship of a net maximum acceptor impurity density within a p-type pinch layer versus a lateral directional resistance of a p-type pinch layer per unit cell with respect to a vertical type insulated-gate semiconductor device.

In this way, under the condition of setting the threshold voltage $V_{TH}$ as low as about 2 V by diffusion of the surface layer portion, the net maximum impurity density of the p-type pinch layer 14 can be increased to $N_{APP2}$ (=$6 \times 10^{17}$ cm⁻³) from the conventional $N_{APP1}$ (=$1 \times 10^{17}$ cm⁻³), a lateral directional resistance of the p-type pinch layer 14 per unit cell, as in FIG. 20, can correspondingly be decreased to $r_{B2}$ (=127 Ω, corresponds to point F in FIG. 20) about ¼ from the conventional $r_{B1}$ (=442 Ω, corresponds to point E in FIG. 20). Since the lateral directional resistance $r_B$ of the p-type pinch layer 14 is decreased to about ¼, a voltage drop $V_B$ generated by flow of a positive hole current into the lateral directional resistance $r_B$ is reduced to ¼ and an ability to interrupt operation of the parasitic n-p-n transistor is improved to four times when the reverse conducting state across the drain and the source is transferred to the forward conducting state in the power MOSFET.

A junction depth in the lateral direction in the vicinity of the surface of the p-type base layer 8 can be made smaller by the diffusion of the surface layer portion. This comes from the reason that, in boron diffusion at the time of double diffusion, the impurity density distribution on diffusing in the lateral direction is compensated by arsenic of the time of diffusing the surface layer portion, and the net acceptor impurity density distribution in the vicinity of the surface of the p-type base layer 8 is narrowed at its lateral direction. Thus, the junction depth in the lateral direction in the vicinity of the surface of the p-type base layer 8 is shortened to $L_{P20}$ (+1.0 µm) from $L_{P10}$ (=2.0 µm). Hence, the channel length is largely shortened to $L_{CH20}$ (+0.5 µm) from $L_{CH2}$ (=1.5 µm). In the accumulation layer and the neck portion, a n-type region 5 is formed wherein the surface density thereof increases to $8 \times 10^{16}$ cm⁻³ by the diffusion of the surface layer portion.

Figure 21:
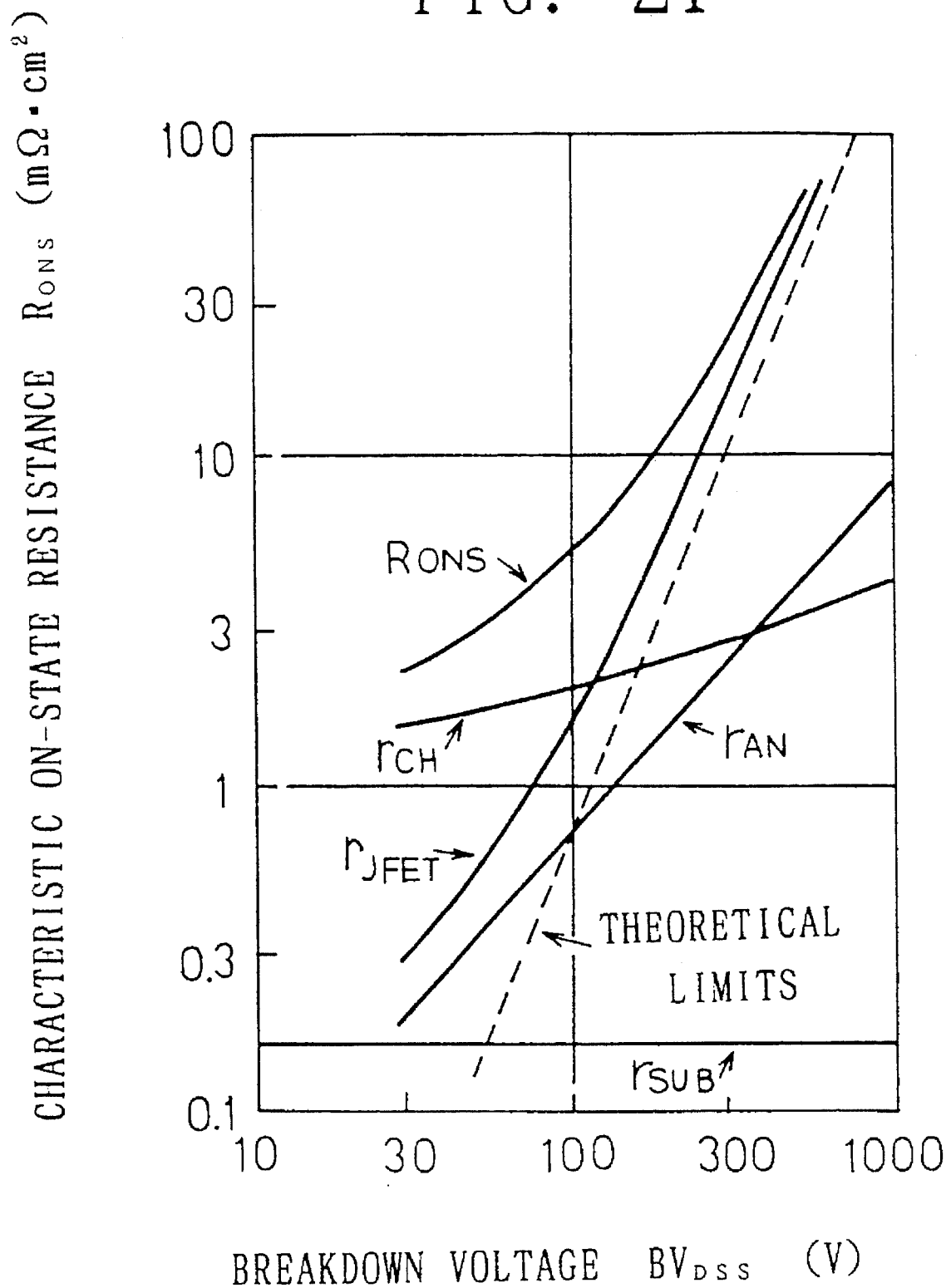
FIG. 21 is a representation of relationship of a characteristic ON-state resistance versus a breakdown voltage of a power MOSFET.
Figure 22:
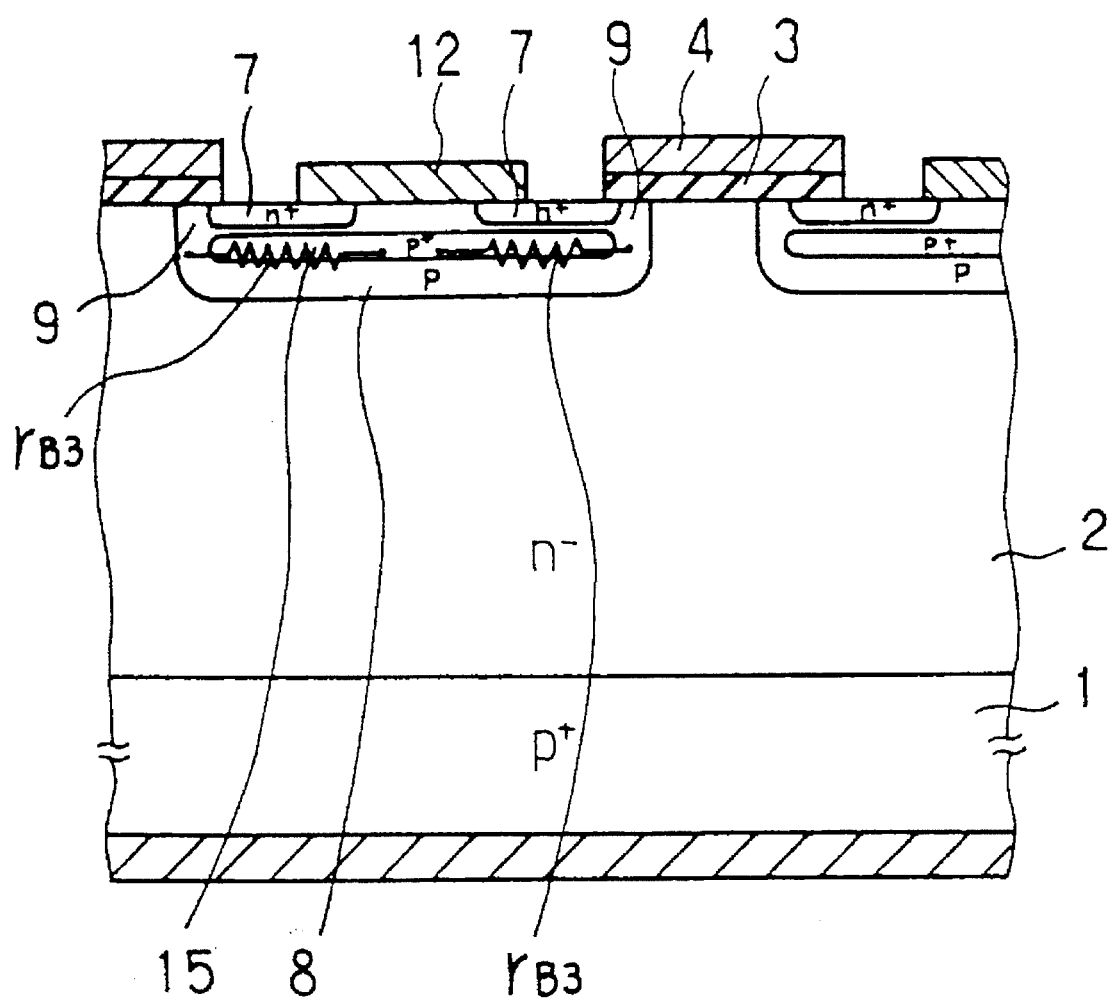
FIG. 22 is a sectional view illustrating the conventional IGBT.

As a result of these, an ON-state resistance of the power MOSFET with a low withstand voltage of equal to or less than 100 V, as shown in FIG. 21 and equation (9), is possible to reduce both a channel resistance $r_{CH}$ of a main component thereof and a distribution resistance $r_{AN}$ formed of the accumulation layer and the neck portion and to greatly decrease the On-state resistance per unit area.

Next, a method of producing the power MOSFET shown in FIG. 2 is described referring to FIGS. 4 to 8 and FIG. 2.

As shown in FIG. 4, first prepared is the wafer 20 in which the n-type epitaxial layer 2 is formed on the main surface of the semiconductor substrate 1 composed of the n⁺-type monocrystalline silicon. This semiconductor substrate 1 has an impurity density of an extent of $10^{20}$ cm⁻³. The epitaxial layer 2 has a thickness of an extent of 7 µm with an impurity density of an extent of $5 \times 10^{15}$ cm⁻³.

As shown in FIG. 5, a field oxide film 50 with a thickness of an extent of 100 nm is formed by thermal-oxidation of the main surface of the wafer 20, thereafter a resist film (not shown) is deposited and subjected to patterning so that a pattern is formed and opened to a center portion of an estimated position of forming a cell in the known photolithography process. The ion injection is performed for boron (B⁺) using this resist film as a mask. After the resist is peeled, a deep p-well 60 having a junction depth of an extent of 2 µm is formed by the thermal diffusion. This deep p-well 60 becomes a part of a base of the p-type base layer 8 which will be described later, finally the function depth increases to about 3 µm. When a high voltage is applied across the drain and the source, a breakdown is allowed to stably generate at a base portion of the p-type base layer 8, thereby there can be achieved an operation for improving a withstand surge property.

In FIG. 6, the ion injection of arsenic (As⁺) is performed on the surface layer portion of the epitaxial layer 2 by penetrating the field oxide film 50 on the main surface of the wafer 20, and a diffusion region of the surface layer portion is formed by the thermal diffusion. A reason to use arsenic as an impurity for forming the surface layer diffusion region is such that the arsenic is a smaller diffusion coefficient than boron at the time of thermal diffusion and thus a final depth of the surface layer diffusion region 65 can be as thin as about an extent of 0.5 µm.

Next, after the field oxide film 50 is removed, the gate oxide film 3 of a thickness of 50 to 100 nm is formed again by thermal oxidation of the main surface of the wafer 20 as shown in FIG. 7, on which a polysilicon film with a thickness of an extent of 400 nm is deposited. A resit film (not shown) is deposited on such polysilicon film and this resist film is subjected to patterning for forming pattern in which an estimated position where a cell will be formed is opened by the known photolithography process. This resist film is used as a mask to etch the polysilicon film and to form the gate electrode 4 which has been subjected to patterning.

To perform the self aligned double diffusion using this gate electrode 4 as a mask, a boron (B⁺) ion injection corresponding to a first diffusion is operated, then a p-well 61 having a junction depth of an extent of 2.5 µm is formed by the thermal diffusion. This p-well 61 and the described deep p-well 60 are made into a unitary body to produce a composite p-well 62. At this time, the p-well 61 performs the lateral directional diffusion at the junction depth of $L_{P2}$ forward the inside form an end portion of the gate electrode 4, this thus gives the lateral directional junction depth of $L_{P3}$ compensated by presence of the surface layer diffusion region 65 as described. In the vertical directional diffusion, the surface layer diffusion region is processed to be diffused at the same time of thermal-diffusing for forming the p-well 61, but, a depth of the surface layer diffusion region 65 is converged to an extent of 0.5 µm even in deeply thermal-diffusing at an extent of 2.5 µm for the junction depth of the p-well 61 because a diffusion coefficient of boron which is impurity for forming the p- well 61 is larger compared to a diffusion coefficient of arsenic. A drift region 6 and the n-type region 5 are formed within the epitaxial layer 2 because the composite p-well 62 is formed.

Next, the resist film (not shown) is deposited on the main surface of the wafer 20. Such resist film is subjected to patterning so that the resist remains only at a central portion of an estimated position where the cell intends to be formed by the known photolithography process. To perform the self aligned double diffusion using the resist film and gate electrode 4 as a mask, phosphorus ion injection ($p^+$) corresponding to the second diffusion is operated. After the resist is peeled, the $n^+$- type source layer 7 having a junction depth of an extent of 0.7 μm as shown in FIG. 8 is formed by the thermal diffusion, and simultaneously the channel 9 is formed. Also at this time, the p-type base layer 8 which is a region where the $n^+$-type source layer 7 is removed from the composite p-well 62 is formed. The p-type base layer 8 is taken from both the p-type pinch layer 14 of a part of p-well 61 and a bottom portion of the deep p-well 60.

Thereafter, a resist film (not shown) is deposited on the main surface of the wafer 20, and subjected to patterning for forming a pattern to open a surface of a central portion of the p-type base layer 8 by the known photolithography process. As shown in FIG. 1 or 2, boron ($B^+$) is ion-injected using the resist film as a mask, and afterwards the resist is removed. The $p^+$-type base contact layer 10 having a diffusion depth of an extent of 0.5 μm is formed by the thermal diffusion. Followingly, the layer-to-layer insulative film 11 composed of BPSG with a thickness of an extent of 1 μm is deposited on the gate electrode 4, and a contact hole is opened in the layer-to-layer insulative film 11 in order to expose each part of the surfaces of the $p^+$-type base contact layer 10 and the $n^+$-type source layer 7 by the known photolithography process. The layer-to-layer insultative film 11 is deposited thereon with an aluminum film forming the source electrode 12, which is allowed to be in ohmic-contact with the $p^+$-type base contact layer 10 and the $n^+$-type source layer 7. After a surface protecting film (not shown) is formed, a multilayer film of Ti/Ni/Au is deposited on a rear surface-side of the semiconductor substrate 1 to produce the drain electrode 13 in ohmic-contact with the semiconductor substrate 1.

The following effect is exhibited in the power MOSFET and the method of producing such device according to the present embodiment as described above referring to FIGS. 4 to 8 and FIG. 2.

It is possible to suppress the threshold voltage of the power MOSFET into a lower value as described, to reduce both the channel resistance of a main component of the ON-state resistance and the distribution resistance composed of the accumulation layer and the neck portion, and to largely decrease the ON-state resistance per unit area. Since the lateral directional resistance of the p- type pinch layer is lowered, this largely raises an ability to reduce a voltage drop generated by the positive hole current flow in the lateral directional resistance of the p-type pinch layer and to interrupt operation of the parasitic n-p-n transistor respectively when the reverse conduction state across the drain and the source is transferred to the forward conduction state. Thereby, the power MOSFET is prevented from breaking.

For the method of production, it is basically required only to add a process of surface layer diffusion to the conventional method and to change a condition of double diffusion for forming the base layer and the source layer. Thus, an additional new process is not required because the surface layer diffusion can be performed in a maskless manner. Therefore, there can be exhibited a satisfactory effect, which prevents various problems such as the fluctuation increases of the ON-state resistance and withstand voltage and the withstand voltage deterioration of the p-type base layer and like drawbacks because the p-well junction depth is not required to decrease other than for necessity for shortening the channel length, and which utilizes advantages such as a controllability, a productivity, a high yield rate, and a lower cost and the like because the planer process is used.

The one embodiment in the foregoing as applied to an IGBT will be described as undermentioned.

In a sectional view of a vertical type insulated-gate semiconductor device in FIG. 1, a sectional view of an IGBT using the $p^+$-type for the semiconductor substrate 1 is shown in FIG. 3. The sectional construction and the producing process of a wafer, which are operations at each main stage in producing the IGBT, are the same as in the power MOSFET shown in FIGS. 4 to 8 and FIG. 2 other than both of the use of $P^+$-type for the semiconductor substrate 1 and the thickness of the epitaxial layer 2, for example, as thick as an extent of 50 μm. Therefore, explanations thereof are omitted throughout, where a construction in the vicinity of the channel portion is equivalent as in FIGS. 16A to 16C already described.

This case of the IGBT exhibits advantages as undermentioned. In a characteristic of the IGBT shown in FIG. 3, a threshold voltage is suppressed to a lower value, and simultaneously an ON-state resistance is reduced in the channel resistance or the distribution resistance composed of the accumulation layer and the neck portion as is the case of the power MOSFET. Thus, the ON-state resistance per unit area can be reduced. The lateral directional resistance per unit area of the p-type pinch layer is lowered to ¼ together with suppression of the threshold voltage to a lower value, the latch-up current value $I_L$ shown in the equation (14) is allowed to increase to about 3200 A/cm² four times larger than about 800 A/cm² to also greatly increase the controllable current range, and to practically eliminate the latch-up. For the producing method, as is the case of the power MOSFET, it is basically required only to add a process of surface layer diffusion to the conventional method and to change a condition of double diffusion for forming the base layer and the source layer. Therefore, there can be exhibited a satisfactory effect to utilize advantages such as a controllability, a productivity, a high yield rate, and a lower cost and the like because the planer process is basically employed.

The present invention has hereinbefore been shown and described for the example where the invention is applied to the n-channel type vertical insulated-gate semiconductor device, in particular to the power MOSFET, and the IGBT having a basical construction. However, it is understood that the present invention is not limited to the embodiments as described above. The foregoing and other various changes can be made therein without departing from the subject matter of the invention. The present invention employs, for example, not only the electric power element but also the integrated element and the like combining with the other functions.

INDUSTRIAL APPLICABILITY

A vertical type insulated-gate semiconductor device according to the present invention is used for electric power semiconductor elements, for example, power switching elements in ignitors of vehicles.

We claim:

1. A vertical type insulated-gate semiconductor device comprising:

a semiconductor substrate having a first impurity concentration;

a semiconductor layer of a first conductivity type and having a second impurity concentration lower than said first impurity concentration of said semiconductor substrate, said semiconductor layer being located on said semiconductor substrate;

an insulated gate structure located on a main surface of said semiconductor layer, said insulated gate structure including a gate electrode;

a well region of a second conductivity type having a first vertical diffusion depth;

a source region of said first conductivity type formed within said well region, said well region and said source region being double-diffused laterally from an edge of said gate electrode into said main surface of said semiconductor layer below said gate electrode to thereby align a channel in a vicinity of said edge of said gate electrode, said channel being located at a surface of said well region below said gate electrode;

a diffusion layer of said first conductivity type formed at said main surface of said semiconductor layer so as to overlap said channel, said diffusion layer having a third impurity concentration higher than said second impurity concentration of said semiconductor layer and a second vertical diffusion depth shallower than said first vertical diffusion depth of said well region, a net amount of a first impurity density of said first conductivity type of said diffusion layer being higher than a net amount of a second impurity density of said second conductivity type of said surface of said well region where said channel is formed;

a compensated region of said first conductivity type formed below said gate electrode and at said main surface of said semiconductor layer proximate to said well region, said compensated region eroding a configuration of said well region at said main surface of said semiconductor layer and below said gate electrode; and a length of said channel being determined by a distance between said source region and said compensated region.

2. A vertical type insulated gate semiconductor device according to claim 1, wherein a net carrier density of said surface of said well region is compensated with said first impurity density of said first conductivity type of said diffusion layer and has a third impurity density of said second conductivity type lower than a fourth impurity density of said well region at a vertical depth deeper than said second vertical diffusion depth of said diffusion layer.

3. A vertical type insulated gate semiconductor device according to claim 2, wherein said second vertical diffusion depth of said diffusion layer is shallower than a junction depth of said source region.

4. A vertical type insulated gate semiconductor device according to claim 3, wherein said second vertical diffusion depth of said diffusion layer is approximately 0.5 μm and said junction depth of said source region is 0.7 μm.

5. A vertical type insulated gate semiconductor device according to claim 2, wherein said semiconductor substrate is of said first conductivity type.

6. A vertical type insulated gate semiconductor device according to claim 2, wherein said semiconductor substrate is of said second conductivity type.

7. A vertical type insulated gate semiconductor device according to claim 1, wherein said second vertical diffusion depth of said diffusion layer is shallower than a junction depth of said source region.

8. A vertical type insulated gate semiconductor device according to claim 7, wherein said second vertical diffusion depth of said diffusion layer is approximately 0.5 μm and said junction depth of said source region is 0.7 μm.

9. A vertical type insulated gate semiconductor device according to claim 7, wherein said semiconductor substrate is of said first conductivity type.

10. A vertical type insulated gate semiconductor device according to claim 7, wherein said semiconductor substrate is of said-second conductivity type.

11. A vertical type insulated gate semiconductor device according to claim 7, wherein first conductivity type impurities forming said diffusion layer have a diffusion coefficient smaller than that of second conductivity type impurities forming said well region.

12. A vertical type insulated gate semiconductor device according to claim 11, wherein said first conductivity type impurities are arsenic.

13. A vertical type insulated gate semiconductor device according to claim 1, wherein said semiconductor substrate is of said first conductivity type.

14. A vertical type insulated gate semiconductor device according to claim 1, wherein said semiconductor substrate is of said second conductivity type.

15. A vertical type insulated gate semiconductor device according to claim 1, wherein first conductivity type impurities forming said diffusion layer have a diffusion coefficient smaller than that of second conductivity type impurities forming said well region.

16. A vertical type insulated gate semiconductor device according to claim 15, wherein said first conductivity type impurities are arsenic.

17. A vertical type insulated gate semiconductor device comprising:

a semiconductor substrate having a first impurity concentration;

a semiconductor layer of a first conductivity type and having a second impurity concentration lower than said first impurity concentration of said semiconductor substrate, said semiconductor layer being located on said semiconductor substrate;

a diffusion layer of said first conductivity type formed at a main surface of said semiconductor layer and having a third impurity concentration higher than said second impurity concentration of said semiconductor layer;

an insulated gate structure located on said main surface of said semiconductor layer, said insulated gate structure including a gate electrode;

a well region of a second conductivity type having a vertical junction depth deeper than a vertical diffusion depth of said diffusion layer, a lateral diffusion length of said well region from an edge of said gate electrode into said main surface of said semiconductor layer below said gate electrode being shorter at a shallow portion than that at a deep portion, and a net first conductivity type impurity density at said diffusion layer being higher than a net second conductivity type impurity density at a surface of said well region where a channel is located;

a source region of said first conductivity type formed within said well region, said well region and said source region being double-diffused laterally from an edge of said gate electrode into said main surface of said semiconductor layer below said gate electrode to thereby align said channel in a vicinity of said edge of said gate electrode, said channel being located at said surface of said well region below said gate electrode; and a compensated area of said first conductivity type disposed below said gate electrode and at said main surface of said semiconductor layer proximate to said well region.

18. A vertical type insulated gate semiconductor device according to claim 17, wherein said vertical diffusion depth of said diffusion layer is shallower than a junction depth of said source region.

19. A vertical type insulated gate semiconductor device according to claim 18, wherein said vertical diffusion depth of said diffusion layer is approximately 0.5 μm and said junction depth of said source region is 0.7 μm.

20. A vertical type insulated gate semiconductor device according to claim 18, wherein said semiconductor substrate is of said first conductivity type.

21. A vertical type insulated gate semiconductor device according to claim 18, wherein said semiconductor substrate is of said second conductivity type.

22. A vertical type insulated gate semiconductor device according to claim 18, wherein said impurities forming said diffusion layer have a first diffusion coefficient smaller than a second diffusion coefficient of said impurities forming said well region.

23. A vertical type insulated gate semiconductor device according to claim 22, wherein said impurities forming said diffusion layer are arsenic.

24. A vertical type semiconductor device comprising:

a semiconductor substrate;

a semiconductor layer of an N-type located on said semiconductor substrate;

a gate electrode located on a main surface of said semiconductor layer with a gate insulation film interposed therebetween;

at least two well regions, each of a P-type, formed at said main surface of said semiconductor layer, said at least two well regions being aligned with ends of said gate electrode;

an accumulation region of said N-type being disposed between said at least two well regions below said gate electrode;

at least two source regions of said N-type formed within said at least two well regions, respectively, a channel being defined in each of said at least two well regions at respective surfaces of said at least two well regions between a corresponding one of said at least two source regions and said accumulation region; and a surface diffusion layer diffused at said main surface of said semiconductor layer including at least an area below said gate electrode, said surface diffusion layer having a first net donor density higher than a second net donor density of said semiconductor layer, and said surface diffusion layer having a diffusion depth shallower than a junction depth of said at least two well regions, whereby a net acceptor density below said gate electrode is compensated with said first net donor density of said surface diffusion layer and is lower at said channels than at said accumulation region;

wherein a width of said accumulation region is wider at a portion proximate to said channels than at a portion deeper than said surface diffusion layer.

25. A vertical type insulated gate semiconductor device according to claim 24, wherein said diffusion depth of said surface diffusion layer is shallower than a junction depth of said source region.

26. A vertical type insulated gate semiconductor device according to claim 25, wherein said diffusion depth of said surface diffusion layer is approximately 0.5 μm and said junction depth of said source region is 0.7 μm.

27. A vertical type insulated gate semiconductor device according to claim 25, wherein said semiconductor substrate is of said N-type.

28. A vertical type insulated gate semiconductor device according to claim 25, wherein said semiconductor substrate is of said P-type.

29. A vertical type insulated gate semiconductor device according to claim 25, wherein N-type impurities forming said surface diffusion layer have a first diffusion coefficient smaller than a second diffusion coefficient of P-type impurities forming said well region.

30. A vertical type insulated gate semiconductor device according to claim 29, wherein said N-type impurities forming said diffusion layer are arsenic.

* * * * *

UNITED STATES PATENT AND TRADEMARK OFFICE
CERTIFICATE OF CORRECTION

PATENT NO. : 5,545,908
DATED : August 13, 1996
INVENTOR(S) : Tokura et al

It is certified that error appears in the above-indentified patent and that said Letters Patent is hereby corrected as shown below:

On the title page: item [75] Inventors, change the first name of the first inventor "Norihiro Tokura" to -- Norihito Tokura --.

Signed and Sealed this

Twenty-fourth Day of June, 1997

Attest:

BRUCE LEHMAN

Attesting Officer

Commissioner of Patents and Trademarks